(12) United States Patent
Chudzik et al.

(10) Patent No.: US 7,425,497 B2
(45) Date of Patent: Sep. 16, 2008

(54) INTRODUCTION OF METAL IMPURITY TO CHANGE WORKFUNCTION OF CONDUCTIVE ELECTRODES

(75) Inventors: Michael P. Chudzik, Danbury, CT (US); Bruce B. Doris, Brewster, NY (US); Supratik Guha, Chappaqua, NY (US); Rajarao Jammy, Hopewell Junction, NY (US); Vijay Narayanan, New York, NY (US); Vamsi K. Paruchuri, New York, NY (US); Yun Y. Wang, Poughquag, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 11/336,727

(22) Filed: Jan. 20, 2006

(65) Prior Publication Data
US 2007/0173008 A1 Jul. 26, 2007

(51) Int. Cl.
H01L 21/283 (2006.01)
(52) U.S. Cl. ...................... 438/591; 438/592
(58) Field of Classification Search ................. 438/591, 438/592, 595
See application file for complete search history.

(56) References Cited

U.S. PATENT DOCUMENTS

| | | | |
|---|---|---|---|
| 6,153,895 A | 11/2000 | Watanabe et al. | |
| 6,890,807 B2 * | 5/2005 | Chau et al. | 438/199 |
| 6,893,927 B1 * | 5/2005 | Shah et al. | 438/287 |
| 6,921,711 B2 * | 7/2005 | Cabral et al. | 438/589 |
| 7,125,762 B2 * | 10/2006 | Brask et al. | 438/197 |
| 7,242,055 B2 * | 7/2007 | Bojarczuk et al. | 257/324 |
| 2004/0256700 A1 | 12/2004 | Doris et al. | |
| 2005/0093104 A1 | 5/2005 | Ieong et al. | |
| 2005/0116290 A1 | 6/2005 | de Souza et al. | |
| 2005/0158974 A1 | 7/2005 | Chau et al. | |
| 2005/0167767 A1 | 8/2005 | Akasaka | |
| 2005/0287759 A1 | 12/2005 | Wang et al. | |
| 2006/0024892 A1 * | 2/2006 | Brask et al. | 438/287 |
| 2006/0151846 A1 * | 7/2006 | Callegari et al. | 257/411 |
| 2006/0163630 A1 * | 7/2006 | Callegari et al. | 257/295 |
| 2006/0244035 A1 * | 11/2006 | Bojarczuk et al. | 257/314 |
| 2006/0289948 A1 * | 12/2006 | Brown et al. | 257/410 |
| 2007/0138578 A1 * | 6/2007 | Callegari et al. | 257/407 |

(Continued)

Primary Examiner—M. Wilczewski
(74) Attorney, Agent, or Firm—Scully, Scott, Murphy & Presser, P.C.; Robert M. Trepp, Esq.

(57) ABSTRACT

Semiconductor structures, such as, for example, field effect transistors (FETs) and/or metal-oxide-semiconductor capacitor (MOSCAPs), are provided in which the workfunction of a conductive electrode stack is changed by introducing metal impurities into a metal-containing material layer which, together with a conductive electrode, is present in the electrode stack. The choice of metal impurities depends on whether the electrode is to have an n-type workfunction or a p-type workfunction. The present invention also provides a method of fabricating such semiconductor structures. The introduction of metal impurities can be achieved by codeposition of a layer containing both a metal-containing material and workfunction altering metal impurities, forming a stack in which a layer of metal impurities is present between layers of a metal-containing material, or by forming a material layer including the metal impurities above and/or below a metal-containing material and then heating the structure so that the metal impurities are introduced into the metal-containing material.

1 Claim, 4 Drawing Sheets

U.S. PATENT DOCUMENTS

2007/0148838 A1* 6/2007 Doris et al. ................. 438/197
2007/0152276 A1* 7/2007 Arnold et al. ............... 257/369
2007/0164356 A1* 7/2007 Adam et al. ................ 257/347
2007/0173008 A1* 7/2007 Chudzik et al. ............. 438/210
2007/0262451 A1* 11/2007 Rachmady et al. .......... 257/758

* cited by examiner

INTRODUCTION OF METAL IMPURITY TO CHANGE WORKFUNCTION OF CONDUCTIVE ELECTRODES

FIELD OF THE INVENTION

The present invention relates to semiconductor structures, and more particularly to semiconductor structures such as, for example, field effect transistors (FETs) or metal-oxide-semiconductor capacitors (MOSCAPs), in which the workfunction of a conductive electrode stack is changed by introducing metal impurities into a metal-containing material layer which, together with a conductive electrode, is present in the electrode stack. The choice of metal impurities depends on whether the electrode is to have an n-type workfunction or a p-type workfunction. The present invention also provides a method of fabricating such semiconductor structures.

BACKGROUND OF THE INVENTION

In standard silicon complementary metal oxide semiconductor (CMOS) technology, n-type field effect transistors (nFETs) use an As or P (or another donor) doped n-type polysilicon layer as a gate electrode that is deposited on top of a silicon dioxide or silicon oxynitride gate dielectric layer. The gate voltage is applied through this polysilicon layer to create an inversion channel in the p-type silicon underneath the gate oxide layer.

In future technology, silicon dioxide or silicon oxynitride dielectrics will be replaced with a gate material that has a higher dielectric constant. These materials are known as "high k" materials with the term "high k" denoting an insulating material whose dielectric constant is greater than about 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Silicon metal oxide semiconductor field effect transistors (MOSFETs) fabricated with a hafnium-based dielectric as the gate dielectric suffer from a non-ideal threshold voltage when n-MOSFETs are fabricated. This is a general problem, and in particular, when the MOSFET consists of $HfO_2$ as the dielectric and TiN/polySi as the gate stack, the threshold voltage is in the 0.45 to 0.7 V range typically after standard thermal treatments. Ideally, the threshold voltage for long channel nFETs should be around 0 to 0.2V or so.

In view of the above-mentioned problem with prior art Si MOSFETs that include a Hf-based dielectric or other high k dielectric, there is a need for providing a method and structure that is capable of stabilizing the flatband voltages and threshold voltages in semiconductor structures that contain such high k gate dielectric materials.

SUMMARY OF THE INVENTION

The present invention provides semiconductor structures in which the workfunction of a conductive electrode stack is changed by introducing at least one metal impurity to a metal-containing material layer that is located between a conductive electrode and a high k dielectric. The term "high k dielectric" is used throughout the present application to denote any insulating material whose dielectric constant is greater than that of silicon dioxide. That is, the high k dielectrics employed in the present invention have a dielectric constant, as measured in a vacuum, that is greater than 4.0. The ability to change or modify the workfunction of a material stack including a high k dielectric is critical for improving the performance of a semiconductor device that includes the same.

It is noted that in the past, the workfunction of a material stack including a high k dielectric was changed by modifying the dielectric or by introducing a low or high workfunction metal under a gate stack including a metal layer and a gate electrode. In the present invention, the workfunction modification occurs by providing a gate stack that includes a metal impurity containing layer which is present beneath a conductive electrode.

In general terms, a semiconductor structure is provided that comprises:

a material stack comprising a dielectric having a dielectric constant of greater than silicon dioxide, a metal impurity containing layer comprising a metal-containing material and at least one workfunction altering metal impurity located above said dielectric, and a conductive electrode located above said metal impurity containing layer.

In a preferred embodiment of the present, a semiconductor structure is provided that comprises:

a material stack comprising a Hf-based dielectric, a metal impurity containing layer comprising TiN or TiON and at least one workfunction altering metal impurity located above said Hf-based dielectric, and a polysilicon electrode located above said metal impurity containing layer.

In addition to the semiconductor structures mentioned above, the present invention also provides a method of altering the workfunction of a conductive gate stack that includes:

providing a material stack that comprises a dielectric having a dielectric constant of greater than silicon dioxide, a metal-containing material layer located above said dielectric, and a conductive electrode located above said metal-containing material layer; and introducing at least one workfunction altering metal impurity into said metal-containing material layer wherein said at least one workfunction altering metal impurity is introduced during forming of a metal impurity containing layer or after formation of a layer containing said metal-containing material layer.

In one embodiment of the present invention, the at least one workfunction altering metal impurity and said metal-containing material layer are formed by codeposition providing a metal impurity containing layer containing both a metal-containing material and said at least one metal impurity.

In another embodiment, a first layer of a metal-containing material is formed, followed by a layer containing the metal impurities, followed by a second layer of the metal-containing material.

In yet another embodiment of the present invention, a material containing the metal impurities is formed below and/or above a metal-containing material and the metal impurities are then introduced into the metal-containing material by a subsequent thermal process.

DETAILED DESCRIPTION OF THE INVENTION

Figure 1A:
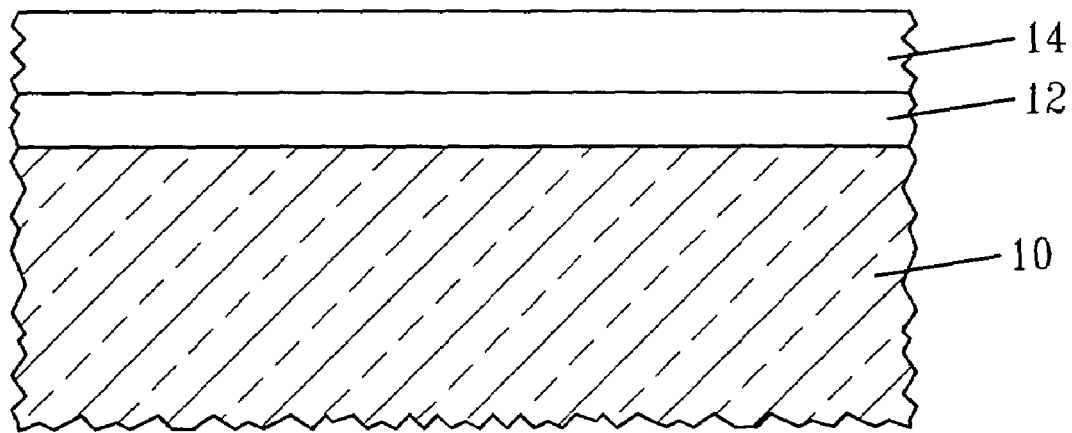
FIGS. 1A-1E are pictorial representations (through cross sectional views) depicting basic processing steps, including alternative embodiments, of the present invention.

The present invention, which provides a semiconductor structure in which the workfunction of a conductive electrode stack is changed by introducing a metal impurity into a metal-containing material layer of the gate stack as well as a method of forming the same, will now be described in greater detail by referring to the following discussion and drawings that accompany the present application. It is noted that the drawings of the present application are provided for illustrative purposes and, as such, they are not drawn to scale. Also, like and/or corresponding elements are referred to herein using like reference numerals.

It is again emphasized that prior art Si MOSFETs fabricated with hafnium oxide as the gate dielectric suffer from a non-ideal threshold voltage when n-MOSFETs are fabricated. When the stacks consist of $HfO_2$ as the dielectric, and TiN/polysilicon as the gate stack, the long channel nFET threshold voltage is in the range of 0.45 to 0.7 V range typically after standard thermal treatments. Ideally, the threshold voltage for long channel nFETs should be around 0 to 0.2V or so. The present invention solves this problem by introducing at least one metal impurity into a metal-containing material layer of the gate stack that introduces a shift in the threshold voltage to the desired voltage.

The material stack of the present invention together with the processing steps that are used in forming the same will be described first followed by a description of the same as a component of a MOSCAP and a MOSFET. It is noted that although the MOSCAP and the MOSFET are shown as separate structures, the present invention also contemplates structures which include both the MOSCAP and the MOSFET on a surface of a single semiconductor substrate. It is also noted that in the present invention, the metal impurity containing layer and the conductive gate electrode form a gate stack to which the inventive method is applicable.

Reference is first made to FIGS. 1A-1E which are pictorial representations (through cross sectional views) depicting the basic processing steps that are used in forming the inventive material stack on the surface of a semiconductor substrate. FIG. 1A shows an initial structure that is formed in the present invention that includes a semiconductor substrate 10, an optional interfacial layer 12 on a surface of the semiconductor substrate 10 and a high k, e.g., Hf-based, dielectric 14 that is located on the optional interfacial layer 12. When the interfacial layer 12 is not present, the high k dielectric 14 is located on a surface of the semiconductor substrate 10.

The semiconductor substrate 10 of the structure shown in FIG. 1A comprises any semiconducting material including, but not limited to: Si, Ge, SiGe, SiC, SiGeC, GaAs, GaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques such as described, for example, in U.S. Ser. No. 10/250,241, filed Jun. 17, 2003, now U.S. Publication No. 20040256700A1, U.S. Ser. No. 10/725,850, now U.S. Publication No. 20050116290, filed Dec. 2, 2003, and U.S. Ser. No. 10/696,634, filed Oct. 29, 2003, now U.S. Publication No. 20050093104, the entire contents of each are incorporated herein by reference.

The semiconductor substrate 10 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After processing the semiconductor substrate 10, an interfacial layer 12 is optionally formed on the surface of the semiconductor substrate 10 by chemical oxidation. The optional interfacial layer 12 is formed utilizing a conventional wet chemical process technique that is well known to those skilled in the art. Alternatively, the layer may be formed by thermal oxidation or oxynitridation. When the substrate 10 is a Si-containing semiconductor, the interfacial layer 12 is comprised of chemical oxide grown by wet processing, or thermally grown silicon oxide, silicon oxynitride or a nitrided silicon oxide. When the substrate 10 is other than a Si-containing semiconductor, the interfacial layer may comprise a semiconducting oxide, a semiconducting oxynitride or a nitrided semiconducting oxide.

The thickness of the interfacial layer 12 is typically from about 0.5 to about 1.2 nm, with a thickness from about 0.8 to about 1 nm being more typical. The thickness, however, may be different after processing at higher temperatures, which are usually required during CMOS fabrication.

In accordance with an embodiment of the present invention, the interfacial layer 12 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C. Alternately, the interfacial layer can also be formed by treating the HF-last semiconductor surface in ozonated aqueous solutions, with the ozone concentration usually varying from, but not limited to: 2 parts per million (ppm) to 40 ppm.

Next, a high k dielectric 14 can be formed on the surface of the interfacial layer 12, if present, or the surface of the semiconductor substrate 10 by a deposition process such as, for example, chemical vapor deposition (CVD), plasma-assisted CVD, physical vapor deposition (PVD), metalorganic chemical vapor deposition (MOCVD), atomic layer deposition (ALD), evaporation, reactive sputtering, chemical solution deposition and other like deposition processes. The high k dielectric 14 may also be formed utilizing any combination of the above processes.

The high k dielectric 14 employed in the present invention is any dielectric material having a dielectric constant of greater than about 4.0, typically greater than about 7.0. Note that silicon dioxide has a dielectric constant of 4.0 and, as such, the present invention contemplates any dielectric whose dielectric constant is greater than that of silicon dioxide. The high k dielectric 14 is typically a metal oxide or mixed metal oxide that is well known to those skilled in the art. Illustrative examples of such high k dielectrics include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, Hf-based dielectrics (to be described in greater detail herein below), and combinations including multilayers thereof. Preferably, the high k dielectric 14 is a Hf-based dielectric, which may optional include a rare earth metal oxide as well.

The term 'Hf-based dielectric' is intended herein to include any high k dielectric containing hafnium, Hf. Examples of such Hf-based dielectrics comprise hafnium oxide ($HfO_2$), hafnium silicate ($HfSiO_x$), Hf silicon oxynitride (HfSiON) or multilayers thereof. In some embodiments, the Hf-based dielectric comprises a mixture of $HfO_2$ and $ZrO_2$. Typically, the Hf-based dielectric is hafnium oxide or hafnium silicate. Hf-based dielectrics typically have a dielectric constant that is greater than about 10.0.

The physical thickness of the high k dielectric 14 may vary, but typically, the high k dielectric 14 has a thickness from about 0.5 to about 10 nm, with a thickness from about 0.5 to about 3 nm being more typical.

In one embodiment of the present invention, the high k dielectric 14 is hafnium oxide that is formed by MOCVD were a flow rate of about 70 to about 90 mgm of hafnium-tetrabutoxide (a Hf-precursor) and a flow rate of $O_2$ of about 250 to about 350 sccm are used. The deposition of Hf oxide occurs using a chamber pressure between 0.3 and 0.5 Torr and a substrate temperature of between 400° and 500° C.

In another embodiment of the present invention, the high k dielectric 14 is hafnium silicate which is formed by MOCVD using the following conditions (i) a flow rate of the precursor Hf-tetrabutoxide of between 70 and 90 mg/m, a flow rate of $O_2$ between 25 and 100 sccm, and a flow rate of $SiH_4$ of between 20 and 60 sccm; (ii) a chamber pressure between 0.3 and 0.5 Torr, and (iii) a substrate temperature between 400° and 500° C.

Next, and in one embodiment of the present invention, a metal impurity containing layer 18 comprising a metal-containing material and at least one metal impurity is formed on the surface of the high k dielectric 14; See FIG. 1B. The metal impurity (i.e., peak concentration thereof) can be continuously distributed throughout the entire thickness of layer 18 or the metal impurity (peak concentration thereof) can be formed in discrete regions within layer 18. For example, the metal impurities can be present at or near the upper or lower surfaces of layer 18, within approximately the center of layer 18 or in any combination thereof.

The metal-containing material (layer 18 without the impurities) comprises a metallic material and/or a semimetallic material that is capable of conducting electrons. Specifically, the metal-containing material (layer 18 without the metal impurities) is a metallic material such as a metal nitride, metal carbide or a metal silicon nitride. In the embodiment when the metal-containing material (layer 18 without metal impurities) includes a metal, the metal component of the metal-containing material may comprise a metal from Group IVB or VB of the Periodic Table of Elements. Hence, the metal-containing material may include Ti, Zr, Hf, V, Nb or Ta, with Ti being highly preferred. By way of example, the metal-containing material preferably comprises TiN or TiON; note TiN is particularly useful in n-type devices, while TiON is particularly useful in p-type devices.

The metal impurities which are used in the present invention to alter the workfunction of the gate stack (e.g., combination of the metal-containing material (layer 18 without impurities) and the conductive electrode) are dependent upon whether the gate electrode will have n-type workfunction or p-type workfunction. Since the metal impurities are used to alter the workfunction of the gate stack, they can be referred to as "workfunction altering metal impurities". For n-type workfunctions, the metal impurities introduced into the metal-containing material comprise at least one element from Groups IIIB, IVB or VB of the Periodic Table of Elements (the nomenclature of the elements is based on the CAS version). Elements within the Lanthanide Series (e.g., La, Ce, Pr, Nd, Pm, Sm, Eu, Gd, Th, Dy, Ho, Er, Tm, Yb or Lu) also contemplated herein. Illustrative examples of metal impurities that can be used in providing an n-type workfunction to a conductive electrode comprise, but are not limited to: Sc, Y, La, Zr, Hf, V, Nb, Ta, Ti and elements from the Lanthanide Series, with the proviso that the metal impurity is different from the metal present in the 'pure' metal-containing material. Preferably, the impurity used in providing the n-type workfunction shift is one element from the Lanthanide group. For p-type workfunctions, the metal impurities introduced into the metal-containing material comprise at least one element from Groups VIB, VIIB and VIII of the Periodic Table of Elements (the nomenclature of the elements is based on the CAS version). Illustrative examples of metal impurities that can be used in providing a p-type workfunction to a conductive electrode comprise, but are not limited to: Re, Fe, Ru, Co, Rh, Ir, Ni, Pd, and Pt, with the proviso that the metal impurity is different from the metal present in the 'pure' metal-containing material. Preferably, the impurity used in providing the p-type workfunction shift is one of Pd.

Figure 1B:
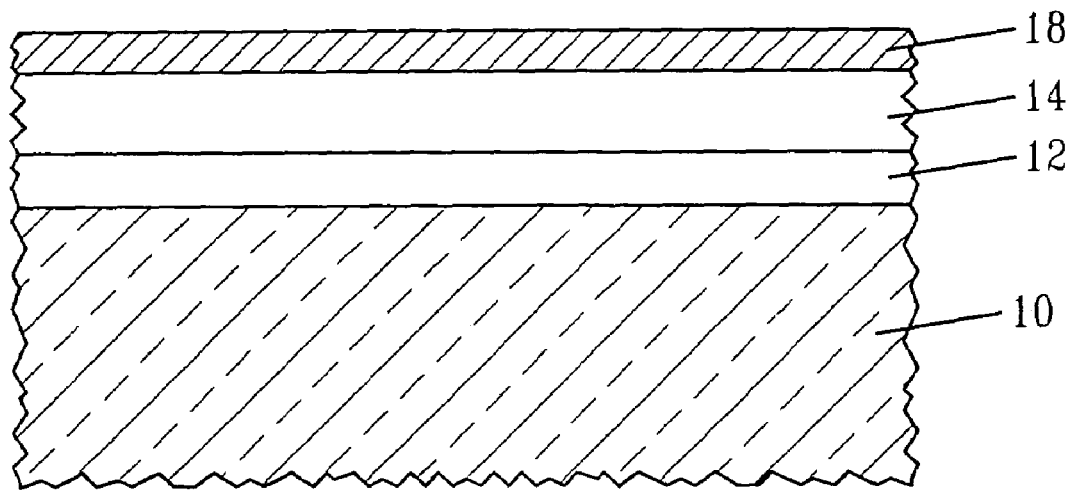

In this particularly embodiment of the present invention illustrated in FIG. 1B, the metal impurity containing layer 18 is formed utilizing a codeposition process in which both the metal-containing material (pure metal-containing material without impurities) and the impurities are deposited at substantially the same time. The codeposition can be performed by using a metallic or semimetallic target, e.g., Ti target, with a certain amount of impurity in the target and layer 18 can be formed within any reactor chamber. Another codeposition method that can be used in the present invention in providing layer 18 is chemical vapor deposition or plasma enhanced chemical vapor deposition wherein precursors of the metal-containing material and the impurity are used.

Notwithstanding the codeposition technique used, layer 18, which includes the desired impurity (or impurities), has an as deposited thickness from about 0.1 to about 0.2 nm, with a thickness from about 0.1 to about 1 nm being even more typical.

Figure 1C:
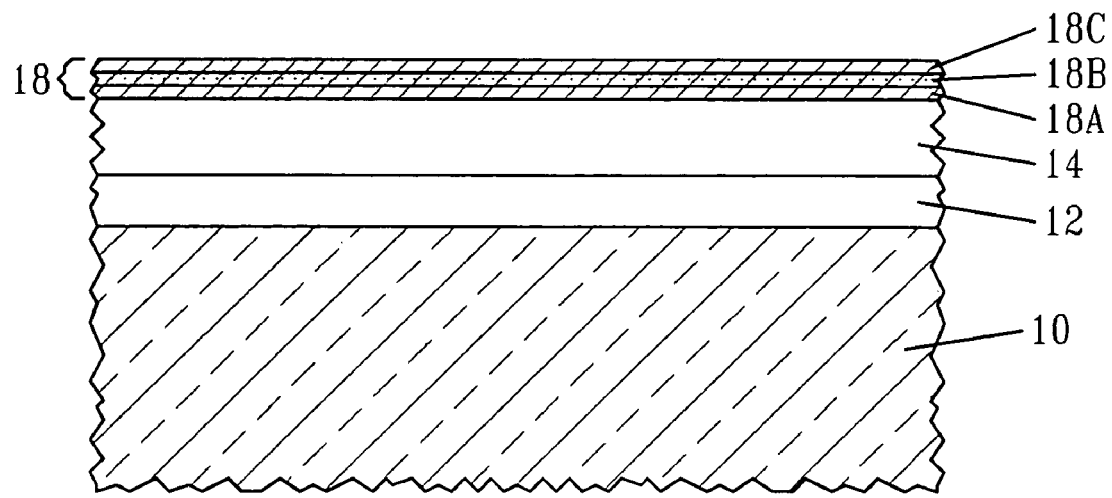

In another embodiment of the present invention, a 'pure' metal-containing material is first deposited, followed by a layer which contains the metal impurities, followed by another 'pure' metal-containing material. The structure formed utilizing this embodiment of the present invention is shown in FIG. 1C, for example. In FIG. 1C, reference numeral 18A denotes the first deposited 'pure' metal-containing material, reference numeral 18B denotes a layer of metal impurities and reference numeral 18C denotes the second deposited 'pure" metal-containing material. It is noted that layers 18A, 18B, and 18C form a metal impurity containing layer 18 that includes the 'pure' metal-containing material and metal impurities.

In this embodiment of the present invention, the 'pure' metal-containing material is formed utilizing a conventional deposition process such as, for example, CVD, PECVD, physical vapor deposition (PVD), atomic layer deposition (ALD), sputtering or evaporation. In one embodiment of the present invention, the metal-containing material is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

The layer of metal impurity is formed also utilizing a conventional deposition process such as, for example, CVD, PECVD, PVD, ALD, sputtering or evaporation. The particular type of metal impurity within layer 18B includes the metal impurities listed above in the embodiment wherein codeposition was employed.

The thickness of the first deposited 'pure' metal-containing material 18A may vary depending upon the type of material employed as well as the technique used in forming the same. Typically, the first deposited 'pure' metal-containing material 18A has a thickness from about 0.1 to about 0.2 nm, with a thickness from about 0.1 to about 1 nm being even more typical. The thickness of the second deposited 'pure' metal-containing material 18C is typically within the ranges mentioned above as well. The thickness of the layer 18B containing the metal impurities may vary, but typically, layer 18B has a thickness from about 0.1 to about 0.2 nm, with a thickness from about 0.1 to about 1 nm being even more typical.

In another embodiment of the present invention, a material (dielectric, sacrificial or conductive, for example) containing the metal impurities is formed above and/or below a 'pure' metal-containing material and then a thermal process is used to introduce the metal impurities to the 'pure' electrically conductive material. This embodiment of the present invention is shown, for example, in FIG. 1D. In this drawing, reference numeral 20 is used as defining the material that contains the metal impurities and reference numeral 18A is used as defining the 'pure' metal-containing material. In this embodiment of the present invention, at least one layer 20 of a material containing metal impurities needs to be present and adjacent said 'pure' metal-containing material 18A. The structure shown is prior to the thermal process which introduces the metal impurities into layer 18A. In some embodiments, the material 20 atop the structure may be removed after the impurities have been introduced into the 'pure' metal-containing material 18A.

The material containing the metal impurities 20 can be formed utilizing any conventional deposition process. Illustrative examples of deposition processes that can be used in forming layer 20 include, but are not limited to: CVD, PECVD, ALD, evaporation, or chemical solution deposition. The thickness of layer 20 may vary depending on the material of the layer as well as the technique used in forming the same. Typically, the material containing impurities 20 has a thickness from about 0.1 to about 2 nm, with a thickness from about 0.1 to about 0.2 nm being even more typical.

Figure 1D:
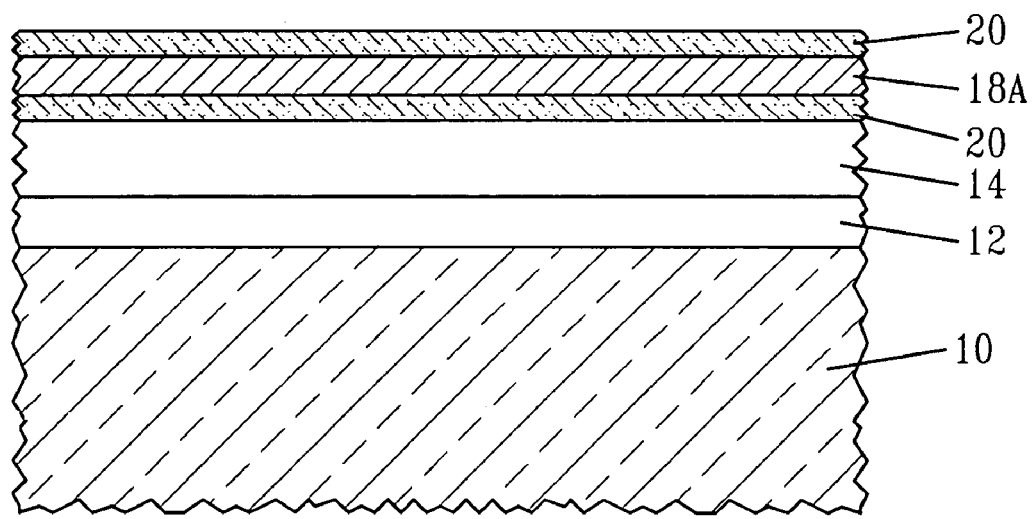

Layer 18A shown in FIG. 1D can be formed as described above and it may comprise one of the above mentioned materials whose thickness is within the ranges as also described above.

As stated above, the metal impurities are introduced into layer 18A utilizing a thermal technique. The thermal technique typically follows the formation of the structure shown in FIG. 1D. In some embodiments, a later thermal process can be used to introduce the metal impurities into layer 18A. The thermal technique typically comprises a temperature that is about 800° C. or greater, with a temperature from about 900° to about 1200° C. being even more typical. The duration of this thermal technique may vary, with a range from about 1 to about 1000 seconds being typical. The thermal technique used for the introduction of the metal impurities into layer 18A may comprise a furnace anneal, a source/drain activation anneal, a rapid thermal anneal, a spike anneal, a laser anneal, a subsequent deposition process in which the above mentioned temperature range is used, or any combination thereof.

Figure 1E:
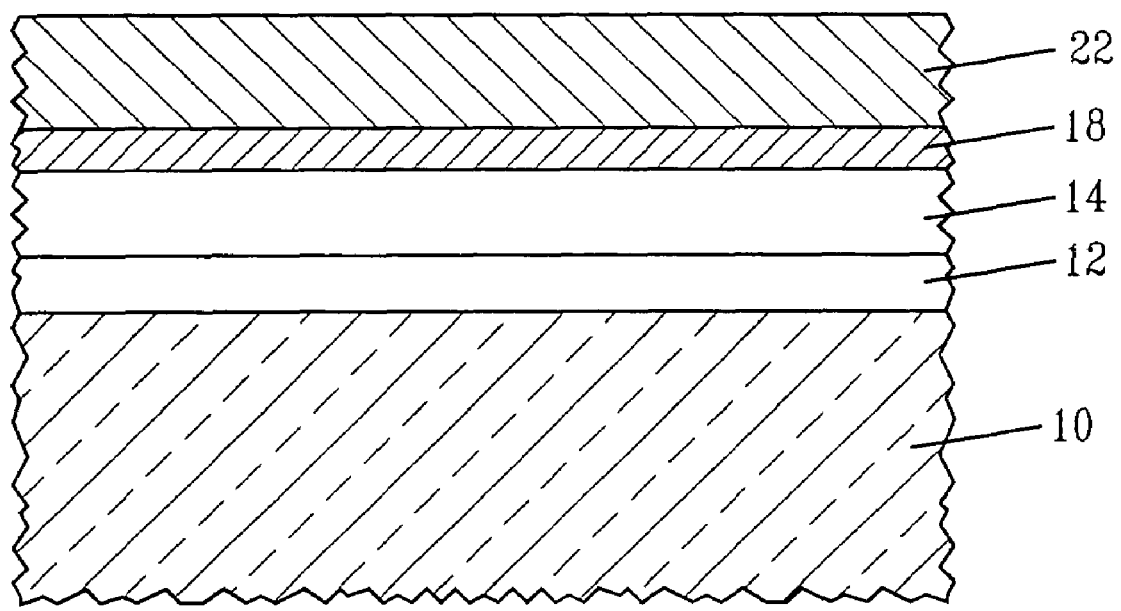

Following the formation of one of the structures shown in FIGS. 1B, 1C, or 1D, a conductive electrode 22 is formed atop the upper most layer of the particular structure. The resultant structure including the gate electrode 22 located atop the structure provided in FIG. 1B is shown in FIG. 1E. The other two structures (using the structure of FIGS. 1C and 1D) would be similar to the one depicted in FIG. 1E and hence they are not specifically shown herein.

Specifically, a blanket layer of a conductive material, which formed the conductive electrode 22, is formed on layer 18, or optionally layer 20, if the embodiment shown in FIG. 1D is used, utilizing a known deposition process such as, for example, physical vapor deposition, CVD or evaporation. The conductive material includes, but is not limited to: Si-containing materials such as Si or a SiGe alloy layer in either single crystal, polycrystalline or amorphous form. The conductive material may also be a conductive metal or a conductive metal alloy. Combinations of the aforementioned conductive materials are also contemplated herein. Si-containing materials are preferred as the conductive electrode 22, with polySi being most preferred. In addition to aforementioned conductive materials, the present invention also contemplates instances wherein the conductive electrode 22 is fully silicided or a stack including a combination of a silicide and Si or SiGe. The silicide is made using a conventional silicidation process well known to those skilled in the art. Fully silicided gates can be formed using a conventional replacement gate process; the details of which are not critical to the practice of the present invention. The blanket layer of conductive electrode material may be doped or undoped. If doped, an in-situ doping deposition process may be employed in forming the same. Alternatively, a doped gate conductor can be formed by deposition, ion implantation and annealing. The ion implantation and annealing can occur prior to or after a subsequent etching step that patterns the material stack. Doping of the conductive electrode 22 will further shift the workfunction of the gate conductor formed. Illustrative examples of dopant ions for nMOSFETs include elements from Group VA of the Periodic Table of Elements (Group IIIA elements can be used when pMOSFETs are formed). The thickness, i.e., height, of the conductive electrode 22 deposited at this point of the present invention may vary depending on the deposition process employed. Typically, the conductive electrode 22 has a vertical thickness from about 20 to about 180 nm, with a thickness from about 40 to about 150 nm being more typical.

Figure 2A:
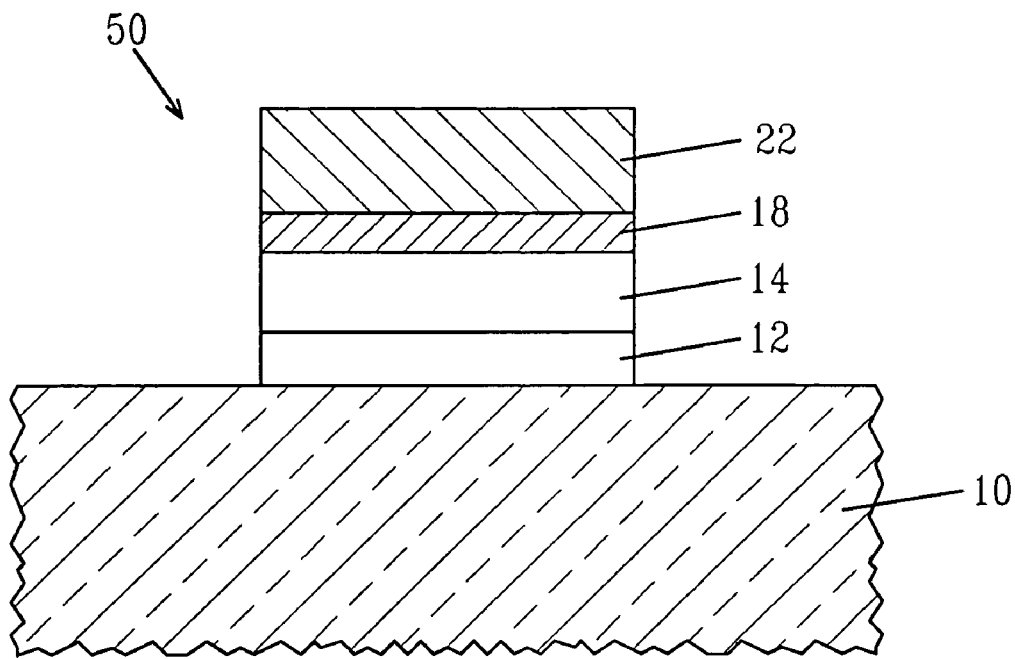
FIGS. 2A-2B are semiconductor structures, a MOSCAP and a MOSFET, respectively that can include the inventive stack formed as illustrated in FIGS. 1A-1E.
Figure 2B:
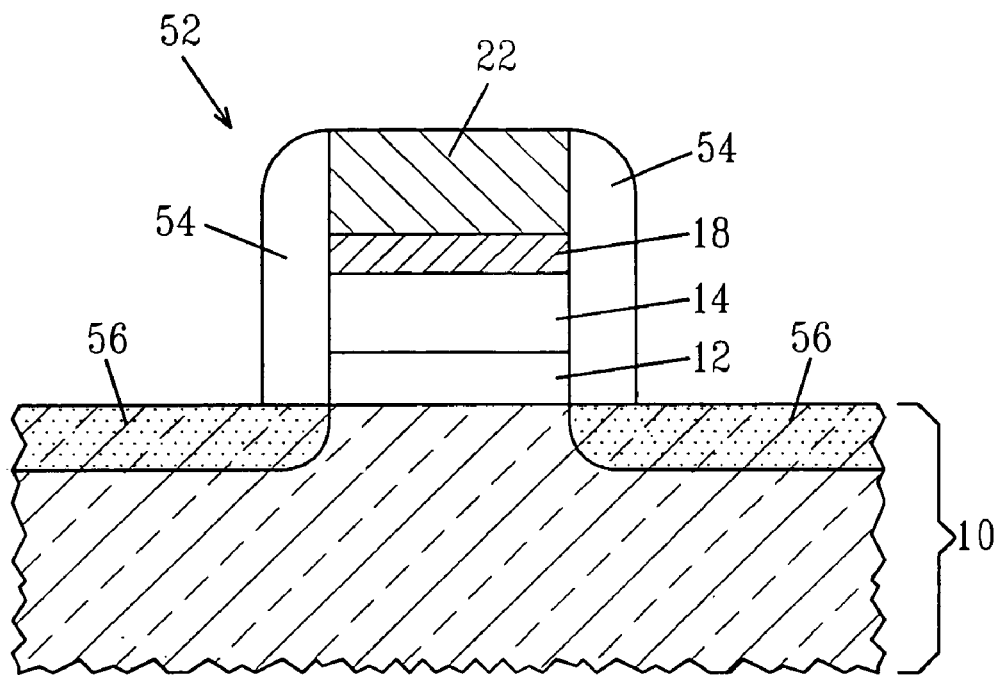

The material stack structure shown in FIG. 1E (optionally including layer 20 above and/or below layer 18) can then be fabricated into a MOSCAP 50 as shown in FIG. 2A or a MOSFET 52 as shown in FIG. 2B utilizing conventional processes that are well known in the art. Each of the illustrated structures includes a material stack such as shown in FIG. 1E which has been at least patterned by lithography and etching.

The MOSCAP formation includes forming a thermal sacrificial oxide (not shown) on the surface of the semiconductor substrate. Using lithography, the active areas of the capacitor structure are opened in the field oxide by etching. Following the removal of the oxide, the material stack as shown in FIG. 1E is formed as described above. Specifically, the material stack was provided, patterned by lithography and etching, and then the dopants are introduced into the conductor 22. The dopants are typically P (implant dose of 5E15 ions/cm² using an implant energy of 12 keV). The dopants are activated using an activation anneal that is performed at 950° C. to 1000° C. for about 5 seconds. In some cases, a forming gas anneal (5-10% hydrogen) can follow which is performed between 500° to 550° C. for interfacial layer/semiconductor substrate interface state passivation.

The MOSFET formation includes first forming isolation regions, such as trench isolation regions, within the substrate as described above. A sacrificial oxide layer can be formed atop the substrate prior to formation of the isolation regions. Similar to the MOSCAP and after removing the sacrificial oxide, a material stack as described above is formed. Following patterning of the material stack, at least one spacer 54 is typically, but not always, formed on exposed sidewalls of each patterned material stack. The at least one spacer 54 is comprised of an insulator such as an oxide, nitride, oxynitride and/or any combination thereof. The at least one spacer 54 is formed by deposition and etching.

The width of the at least one spacer 54 must be sufficiently wide such that the source and drain silicide contacts (to be subsequently formed) do not encroach underneath the edges of the patterned material stack. Typically, the source/drain silicide does not encroach underneath the edges of the patterned material stack when the at least one spacer 54 has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions 56 are then formed into the substrate. The source/drain diffusion regions 56 are formed utilizing ion implantation and an annealing step. The annealing step serves to activate the dopants that were implanted by the previous implant step. The conditions for the ion implantation and annealing are well known to those skilled in the art. The source/drain diffusion regions 56 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 500° to 550° C. for interfacial layer/semiconductor substrate interface state passivation.

The above processing steps form the structure shown in FIG. 2B. Further CMOS processing such as formation of silicided contacts (source/drain and gate) as well as formation of BEOL (back-end-of-the-line) interconnect levels with metal interconnects can be formed utilizing processing steps that are well known to those skilled in the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of changing workfunction of a conductive stack comprising:
   providing a material stack that comprises a Hf-based dielectric having a dielectric constant of greater than silicon dioxide, a metal-containing material including at least one metal selected from Ti, Zr, Hf, V, Nb and Ta located above said Hf-based dielectric, and a conductive electrode located above said metal-containing material; and
   introducing at least one workfunction altering metal impurity into said metal-containing material, wherein said at least one workfunction altering metal impurity is introduced during forming of a metal impurity containing layer or after formation of a layer containing said metal-containing material, and said introducing is selected from
   (i) codepositing the at least one workfunction altering metal impurity and the metal-containing material,
   (ii) forming a first layer of the metal-containing material, forming a layer containing the metal impurities on said first layer, and forming a second layer of the metal-containing material, and
   (iii) forming a material layer containing the metal impurities below and/or above the metal-containing material, and subjecting the material stack to a thermal process,
   and with the proviso that when an n-type workfunction is required, the at least one workfunction altering metal impurity comprises at least one element from Groups IIIB, IVB, or VB of the Periodic Table of Elements, and when a p-type workfunction is required the at least one workfunction altering metal impurity comprises at least one element from VIB, VIIB or VIII of the Periodic Table of Elements.

* * * * *